(12) United States Patent
Andreev et al.

(10) Patent No.: US 12,191,436 B2
(45) Date of Patent: Jan. 7, 2025

(54) EMITTER AND METHOD FOR EMITTING LIGHT

(71) Applicant: WÜRTH ELEKTRONIK EISOS GMBH & CO. KG, Waldenburg (DE)

(72) Inventors: Zhelio Andreev, Schwäbisch Hall (DE); Marcel Dörr, Ludwigsburg (DE)

(73) Assignee: WURTH ELEKTRONIK EISOS GMBH & CO. KG, Waldenburg (DE)

( * ) Notice: Subject to any disclaimer, the term of this patent is extended or adjusted under 35 U.S.C. 154(b) by 428 days.

(21) Appl. No.: 17/629,195

(22) PCT Filed: Jul. 28, 2020

(86) PCT No.: PCT/EP2020/071189
§ 371 (c)(1),
(2) Date: Jan. 21, 2022

(87) PCT Pub. No.: WO2021/037459
PCT Pub. Date: Mar. 4, 2021

(65) Prior Publication Data
US 2022/0246817 A1   Aug. 4, 2022

(30) Foreign Application Priority Data
Aug. 30, 2019   (DE) .................... 10 2019 213 150.6

(51) Int. Cl.
*H01L 33/64*   (2010.01)
*H01L 25/075*   (2006.01)
(Continued)

(52) U.S. Cl.
CPC ........ *H01L 33/642* (2013.01); *H01L 25/0753* (2013.01); *H01L 33/54* (2013.01);
(Continued)

(58) Field of Classification Search
CPC ..... H01L 33/64; H01L 33/642; H01L 33/648; H01L 2933/0075; H01L 33/56;
(Continued)

(56) References Cited

U.S. PATENT DOCUMENTS

| 2003/0052584 A1 | 3/2003 | Matsui et al. |
| 2005/0094397 A1 | 5/2005 | Yamada et al. |

(Continued)

FOREIGN PATENT DOCUMENTS

| DE | 102007054039 | 3/2009 |
| DE | 102010007687 | 8/2011 |

(Continued)

OTHER PUBLICATIONS

Office Action issued in parallel Taiwanese Patent Application No. 109127795, Mar. 1, 2022, 11 pages w/translation.

(Continued)

*Primary Examiner* — Wasiul Haider
(74) *Attorney, Agent, or Firm* — HSML P.C.

(57) ABSTRACT

An emitter and a method for emitting light are described. The emitter has a substrate with a substrate surface and at least one LED element arranged on the substrate surface for generating the light to be emitted. An active cooling unit for cooling the at least one LED element has at least one cooling channel. The at least one cooling channel is arranged on the substrate surface in a beam path of at least one portion of the light to be emitted, which can be generated by means of the at least one LED element, for redirecting the light to be emitted.

20 Claims, 7 Drawing Sheets

(51) Int. Cl.
*H01L 33/54* (2010.01)
*H01L 33/58* (2010.01)
*H01L 33/56* (2010.01)

(52) U.S. Cl.
CPC .............. *H01L 33/58* (2013.01); *H01L 33/56* (2013.01); *H01L 33/648* (2013.01); *H01L 2933/0058* (2013.01); *H01L 2933/0075* (2013.01)

(58) Field of Classification Search
CPC .............. H05K 1/0203; H05K 1/0272; H05K 2201/064; F21V 29/59
See application file for complete search history.

(56) References Cited

U.S. PATENT DOCUMENTS

| | | | | |
|---|---|---|---|---|
| 2005/0244649 | A1* | 11/2005 | Kashiwagi | C08L 83/04 257/E33.059 |
| 2008/0191236 | A1 | 8/2008 | De Graaf et al. | |
| 2012/0044678 | A1* | 2/2012 | Aggarwal | F21V 29/506 362/235 |
| 2017/0009961 | A1 | 1/2017 | Wertz et al. | |
| 2018/0138378 | A1* | 5/2018 | Hung | H01L 25/0753 |
| 2019/0234618 | A1* | 8/2019 | Reinhard-Herrscher | F21V 29/677 |

FOREIGN PATENT DOCUMENTS

| | | |
|---|---|---|
| DE | 102011003989 | 8/2012 |
| EP | 1 780 804 | 5/2007 |
| JP | 2001-036148 | 2/2001 |
| TW | 200727516 | 7/2007 |

OTHER PUBLICATIONS

International Search Report issued in International Application No. PCT/EP2020/071189, Sep. 24, 2020, 7 pages w/translation.
Examination Report issued in corresponding German Patent Application No. 10 2019 213 150.6, May 7, 2020, 5 pages.
Examination Report issued in corresponding German Patent Application No. 10 2019 213 150.6, Jul. 16, 2021, 6 pages.

* cited by examiner

EMITTER AND METHOD FOR EMITTING LIGHT

CROSS-REFERENCES TO RELATED APPLICATIONS

This application claims the priority of German Patent Application, Serial No. DE 10 2019 213 150.6, filed on Aug. 30, 2019, the content of which is incorporated herein by reference in its entirety as if fully set forth herein.

FIELD OF THE INVENTION

The invention relates to an emitter for emitting light, in particular visible light, infrared light and/or UV light. In particular, the invention relates to a lamp for emitting visible light. Furthermore, the invention relates to a method for emitting light by means of an emitter.

BACKGROUND OF THE INVENTION

EP 1 681 728 A1 describes a luminaire with LED light elements which generate ultraviolet light (UV light). The UV light is converted into visible light via a light conversion member. A heat dissipation element is provided for cooling the light conversion member. From DE 10 2007 054 039 A1, a light emitting diode is known in which liquid is used for light conversion. DE 10 2010 007 687 A1 describes an LED lamp with a heat pipe as a cooling system. US 2005/0094397 A1 describes a light source and a projector.

SUMMARY OF THE INVENTION

It is an object of the present invention to provide an improved emitter for emitting light. In particular, an emitter which is efficient and simple in terms of structure shall be provided.

This object is achieved by an emitter for emitting light, comprising
  a substrate having a substrate surface,
    at least one LED element arranged on the substrate surface for generating the light to be emitted, and
    an active cooling unit for cooling the at least one LED element with at least one cooling channel for a coolant,
    wherein the at least one cooling channel is arranged in a beam path of at least a part of the light to be emitted which can be generated by means of the at least one LED element, for redirecting the light to be emitted,
  wherein the redirection of the light to be emitted takes place without changing a frequency of the light to be emitted. In particular, the at least one cooling channel is arranged on the substrate surface. According to the invention, it has been recognized that the at least one cooling channel used for cooling the at least one LED element can also be used for redirecting the light that can be generated by means of the LED element. By this means, the emission characteristics of the emitter may be adapted in a simple manner. The use of further optics may be dispensed with. The emitter is efficient and has a simple structure.

The light that can be generated by the at least one LED element usually spreads uniformly over the entire solid angle range of $2\pi$ above the substrate surface. By redirecting at least a portion of the light by means of the at least one cooling channel, the distribution of the light, in particular the solid angle range covered, can be changed. The redirection of the light takes place, for example, by reflection and/or refraction of the light at the at least one cooling channel.

By redirecting at least a portion of the light via the at least one cooling channel, it is possible in particular to bundle the light to be emitted by the emitter. By bundling it is understood that the solid angle range in which the emitter emits light is reduced. This increases the intensity of the emitted light in the covered solid angle range. The emitter efficiently illuminates a predefined solid angle range.

The emitter serves to emit light. The at least one LED element directly generates the light to be emitted when the spotlight is used. This means that the emitter emits the light in the frequency range that can be generated by the at least one LED element. A conversion or frequency change of the light generated by means of the at least one LED element is not required. The redirection of the light to be emitted is takes place without changing the frequency of the light to be emitted. In particular, the light generated by means of the at least one LED element is not absorbed by a light conversion unit and converted into a different frequency range. Accordingly, the redirection of at least a portion of the light via the at least one cooling channel takes place without changing the frequency of the light generated by the at least one LED element. The efficiency of the emitter is improved.

The light to be emitted is in particular visible light, infrared light and/or UV light. For example, the light to be emitted may have a frequency between 180 THz and 3000 THz. Visible light is electromagnetic radiation in a frequency range that can be perceived by the human eye. In general, the visible frequency range extends from about 400 THz to about 790 THz. In order to emit visible light, it is generated directly by the LED element. There is no conversion of electromagnetic radiation generated by means of the LED element into visible light. In particular, no conversion of UV light generated by means of an LED element into visible light takes place. An emitter for emitting visible light serves for illumination and is also referred to as a lamp or luminaire. Preferably, the light to be emitted covers the visible frequency range. Particularly preferably, the light to be emitted is white light. The emitter may be a white light luminaire.

Emitters for emitting infrared light may be used, for example, for infrared illumination in surveillance cameras, for image recognition and monitoring systems and for data transmission systems. Infrared light in the near infrared range is particularly suitable. For example, it has a frequency between about 180 THz and about 399 THz.

Emitters for emitting UV light are used, for example, for disinfection, UV curing and UV drying. UV light in the near and medium UV range is particularly suitable. Suitable UV light may, for example, have a frequency between about 791 THz and about 3000 THz. LED elements for generating UV light regularly have only a low degree of efficiency, for example a degree of efficiency of less than 20%. Therefore, a gain in efficiency that can be achieved by redirecting, in particular bundling, the light to be emitted is particularly advantageous for emitters for emitting UV light.

The substrate is in particular a printed circuit board. The substrate has a substrate surface on which the at least one LED element is arranged. In particular, the substrate has a further substrate surface which is spaced apart from the first substrate surface by a substrate thickness. For a more precise distinction, the substrate surface on which the at least one LED element is arranged is also referred to in the following as the first substrate surface and the further substrate surface on which the at least one LED element is not arranged is referred to in the following as the second substrate surface, respectively. If reference is made only to "the substrate surface" in the following, the substrate surface on which the at least one LED element is arranged is meant.

The emitter has at least one LED element, in particular a plurality of LED elements. In the case of a plurality of LED elements, these may be arranged at random on the first substrate surface. Preferably, a plurality of LED elements are arranged at regular intervals on the first substrate surface.

The at least one LED element may have one or more LEDs, respectively. In particular, the at least one LED element has at least one LED chip, in particular a high-power chip. In particular, if visible light can be generated with the LED element, the LED element is also referred to as an LED lighting means. For emitting visible light, the LED lighting means may in particular have an LED chip with which visible light, in particular exclusively visible light, can be generated. Alternatively or additionally thereto, light in the non-visible range can be generated by means of at least one LED chip. If necessary, the at least one LED lighting means may comprise a light conversion unit via which the light generated by means of the at least one LED chip is converted into visible light.

The active cooling unit serves for cooling the at least one LED element. The active cooling unit has at least one cooling channel for a coolant, in particular a cooling liquid. The coolant is pumped in the at least one cooling channel, in particular by a pump of the active cooling unit.

The at least one cooling channel is arranged at or adjacent to the first substrate surface. The at least one cooling channel is arranged on the same substrate surface as the at least one LED element. The at least one LED element is cooled directly. Heat dissipation via the substrate, for example to cooling channels arranged at the second substrate surface, is not necessary. The cooling of the at least one LED element is efficient.

The active cooling unit has in particular a plurality of cooling channels, preferably a network of cooling channels. The course of the cooling channels may be adapted to an arrangement of a plurality of LED elements on the first substrate surface. In particular, a plurality of cooling channels run along the first substrate surface between the LED elements.

An emitter configured such that at least part of the light to be emitted can be redirected by the at least one cooling channel in the direction of a predefined main emission direction, in particular in a main emission direction defined to be perpendicular to the substrate surface ensures a targeted and efficient redirection, in particular bundling, of the light. The main emission direction is defined in particular perpendicular to the substrate surface. A deflection in the direction of the main emission direction is to be understood such that a component of the spreading direction of the beam path of the light is enlarged in the main emission direction. For example, the beam path of light that can be generated by means of the LED element has an emission angle b with respect to the main emission direction, wherein $0° \leq b \leq 90°$. For $b \neq 0°$, the beam path is not parallel to the main emission direction. Where appropriate, the deflection in the main emission direction in particular causes a deflected beam path which has an angle b' with respect to the main emission direction, wherein: $0° \leq b' < b$. The light intensity in the direction of the main emission direction is increased.

An emitter configured such that a cooling channel boundary surface of the at least one cooling channel is formed, at least in regions, in such a way that at least one portion of the light to be emitted is reflected at the cooling channel boundary surface ensures a particularly efficient redirection, in particular bundling, of the light to be emitted. The reflection at the cooling channel boundary surface of the at least one cooling channel causes a targeted and controlled redirection of at least a portion of the light to be emitted. The light reflected at the at least one cooling channel does not penetrate into the cooling channel and thus does not experience any attenuation. The reflection of at least a portion of the light may also occur by total reflection of the light at the cooling channel boundary surface. Additionally or alternatively, a region of the cooling channel boundary surface on which at least a portion of the light that can be generated by means of the at least one LED element impinges may be mirrored.

An emitter configured such that the at least one cooling channel is arranged adjacent to the at least one LED element, in a plane formed by the substrate surface ensures a direct and efficient cooling while maintaining a high light output. The adjacent arrangement of the at least one cooling channel and the at least one LED element further has the advantage that light emanating laterally from the at least one LED element can be redirected efficiently. The at least one cooling channel may be arranged in the plane formed by the substrate surface directly or spaced adjacent to the at least one LED element. In particular, the at least one cooling channel is arranged directly on the substrate surface.

Preferably, the at least one cooling channel and the at least one LED element do not have an overlap perpendicular to the substrate surface. Particularly preferably, the at least one cooling channel and the at least one LED element have no overlap in the main emission direction. The light emitted perpendicular to the substrate surface, in particular the light emitted in the main emission direction, does not undergo any attenuation and/or redirection by the at least one cooling channel. The yield of the light to be emitted is improved, in particular in the main emission direction.

An emitter configured such that the at least one LED element adjoins the at least one cooling channel on at least two sides in the plane defined by the substrate surface ensures an efficient cooling of the at least one LED element. In addition, a greater proportion of the light that can be generated by means of the at least one LED element can be redirected in a direction perpendicular to the substrate surface, in particular in the main emission direction. The bundling of the light is further improved. Here and in the following, "adjacent" is to be understood to mean that the at least one LED element is arranged directly or at a distance adjacent to the at least one cooling channel.

Preferably, the at least one LED element is adjacent to the at least one cooling channel on at least three sides, in particular on all sides, in the plane defined by the substrate surface. Particularly preferably, the at least one LED element is fully surrounded by the at least one cooling channel in the plane defined by the first substrate surface. The same cooling channel, for example a cooling channel curved around the at least one LED element, may be adjacent to different sides of the LED element. Alternatively, different cooling channels may be adjacent to the at least one LED element on different sides.

An emitter configured such that a region of a cooling channel boundary surface of the at least one cooling channel which faces the respectively adjacent LED element extends away from the adjacent LED element with increasing distance from the substrate surface has a high light output and precisely defined emission characteristics. The regions of the cooling channel boundary surface of the at least one cooling channel extending away from the respective adjacent LED element define an opening emission area or light cone starting from the substrate surface.

An emitter configured such that the at least one LED element and the at least one cooling channel are embedded in a transparent encapsulation is stable and can be manufactured easily. The transparent encapsulation protects the at least one LED element and the at least one cooling channel Damages are avoided. The encapsulation in particular has an emission surface at which the light to be emitted by means of the emitter emerges. The emission surface is in particular formed parallel to the substrate surface. The emission surface is in particular perpendicular to the main emission direction.

An emitter configured such that the at least one cooling channel is formed as a cavity in the encapsulation can be manufactured easily and flexibly. The geometry of the cooling channels, in particular their cross-section, can be determined flexibly. The cooling channels formed as a cavity in the encapsulation in particular have no additional cooling channel housing, in particular no separately formed cooling channel side walls. The heat transport takes place in particular directly from the at least one LED element via the encapsulation to the coolant in the cooling channel. The cooling effect is improved.

An emitter configured such that the encapsulation comprises a silicone elastomer and/or a resin, in particular an epoxy resin is inexpensive and easy to manufacture. Resins, in particular epoxy resins, and/or silicone elastomers can be easily applied and cured. The geometry of the encapsulation, in particular the shape of the emission surface, is advantageously easily and flexibly adaptable to the respective requirements, in particular the desired lamp shape.

An emitter configured such that a refractive index $n_E$ of the transparent encapsulation is greater than a refractive index $n_K$ of the cooling channel ensures an efficient redirection of at least a portion of the light. Since the refractive index $n_E$ of the encapsulation is greater than the refractive index $n_K$ of the cooling channel, the encapsulation is an optically denser medium than the cooling channel Thus, a total reflection is possible where the optically denser medium of the encapsulation merges into the cooling channel Due to this, an efficient reflection of at least a portion of the light at the cooling channel boundary surface may take place without the need for a mirroring of the cooling channel boundary surface. As a result, the reflection is possible, in particular without restrictions of the heat transport by the cooling channel boundary surface.

The refractive index of the cooling channel may be predetermined by a cooling channel housing of the cooling channel. If no cooling channel housing is present, in particular if the at least one cooling channel is formed as a cavity in the encapsulation, the refractive index of the cooling channel corresponds in particular to the refractive index of the coolant, in particular of the cooling liquid. Exemplary coolants contain water with a refractive index of 1.33 and/or ethylene glycol with a refractive index of 1.43.

Preferably, the refractive index $n_E$ of the transparent encapsulation is greater than 1.33, in particular greater than 1.43, in particular greater than 1.45, in particular greater than 1.5 For example, the encapsulation may have a refractive index $n_E$ in the range of 1.45 to 1.59, in particular between 1.45 and 1.54. An exemplary epoxy resin sold under the trade name "Nitto Denko NT-8524" has a refractive index of 1.57. An exemplary silicone elastomer sold under the trade name "Dow Corning OE-6550" has a refractive index of 1.54.

An emitter configured such that a surface tangent of a region of a cooling channel boundary surface of the at least one cooling channel facing the at least one LED element runs at an angle d to the substrate surface, where the following applies: $d \leq 90° - \sin^{-1}(n_K/n_E)$, ensures an efficient redirection of light incident on the cooling channel boundary surface of the at least one cooling channel. The angle d between the surface tangent of the region of a cooling channel boundary surface facing the at least one LED element and the first substrate surface determines the relative inclination of the region of the cooling channel boundary surface relative to light that can be generated by the LED element. Depending on the angle d, light emitted at a certain emission angle b with respect to the main emission direction experiences total reflection at the cooling channel boundary surface. Under the condition $$d \leq 180° - b - \sin^{-1}\left(\frac{n_K}{n_E}\right) \qquad (1)$$

the light emitted with an emission angle b to a main emission direction defined to be perpendicular to the first substrate surface is totally reflected at the cooling channel boundary surface. The larger the emission angle b, the smaller the angle d must be to ensure total reflection. For $$d \leq 90° - \sin^{-1}\left(\frac{n_K}{n_E}\right) \qquad (2)$$

it is ensured that light (b=90°) emitted from the at least one LED element parallel to the substrate surface is also totally reflected at the cooling channel boundary surface.

Preferably, the region of the cooling channel boundary surface facing the at least one LED element is planar, and particularly preferably the entire region facing the at least one LED element runs at an angle d to the surface. Where appropriate, the angle d describes the angle at which the entire region of the cooling channel boundary surface facing the at least one LED element runs relative to the substrate surface. The angle d is also referred to in the following as the base angle.

An emitter configured such that a cross-section of the at least one cooling channel is polygonal in shape, in particular triangular, enables a controlled and reliable redirection of the light. Polygonal cross-sections of the at least one cooling channel have planar boundary surface regions where efficient redirection of light can occur. Preferably, the cross-section of the at least one cooling channel has the shape of a triangle, in particular an isosceles triangle. The base of the triangle is particularly preferably parallel to the plane formed by the substrate surface. In particular, the legs of the triangle extend away from the substrate surface. Particularly preferably, the legs of the triangular cross-section of the cooling channel run at a base angle d in relation to the substrate surface which meets the conditions of formula (2).

Alternatively, the at least one cooling channel may have curved cooling channel boundary surface regions. For example, the at least one cooling channel may have convexly curved cooling channel boundary surface regions, in particular be dome-shaped. Preferably, the at least one cooling channel has concavely curved cooling channel boundary surface regions, in particular concave lateral surfaces. The cross-section of the at least one cooling channel may be lenticular, at least in regions. This enables a particularly good bundling of the light.

An emitter configured such that the at least one cooling channel has an extension perpendicular to the substrate surface of between 1 mm and 20 mm, in particular between 1 mm and 15 mm, enables an efficient bundling of the light. The extension of the cooling channel perpendicular to the substrate surface is also referred to hereinafter as the height of the cooling channel. As the height of the cooling channel increases, in particular as the height of the cooling channel increases while the width measured in the direction of the substrate surface remains unchanged, the light cone of the light to be emitted by means of the emitter decreases. The height of the cooling channel can thus be used to adapt the emission characteristics.

In general, the emission characteristics can be dependent on the height of the cooling channel, on the width of the cooling channel, on an extension of the at least one LED element measured in the direction of the substrate surface and/or on a distance between the LED element and the adjacent cooling channel measured in the direction of the substrate surface. In order to adapt the emission characteristics to the respective requirements, in particular to optimize the bundling, the above-mentioned parameters can be varied and matched to one another.

An emitter configured such that the at least one cooling channel contains a coolant comprising ethylene glycol has an efficient cooling system. Ethylene glycol has proven to be an effective coolant. Ethylene glycol has a wide temperature range in which it is liquid.

It is a further object of the invention to improve a method for emitting light, and in particular to make a method for emitting light efficient and simple.

This object is achieved by a method comprising the steps of:
providing an emitter, having
a substrate with a substrate surface,
at least one LED element arranged on the substrate surface for generating light to be emitted, and
an active cooling unit for cooling the at least one LED element, with at least one cooling channel for a coolant,
wherein the at least one cooling channel is arranged in a beam path of at least a portion of the light to be emitted which can be generated by means of the at least one LED element,
generating the light to be emitted by means of the at least one LED element,
cooling of the at least one LED element by means of the active cooling unit and
redirecting at least a portion of the light to be emitted by means of the at least one cooling channel,
wherein the redirection of the light to be emitted takes place without changing a frequency of the light to be emitted. The advantages of the method correspond to the advantages of the emitter described above. The provided emitter may in particular comprise one or more of the features described above in connection with the emitter.

A method in which at least one portion of the light to be emitted is deflected by the at least one cooling channel in the direction of a predefined main emission direction, in particular in the direction of a main emission direction defined to be perpendicular to the substrate surface, enables an efficient and targeted redirection, in particular bundling, of the light to be emitted by means of the emitter.

A method in which the redirection of at least one portion of the light to be emitted takes place by reflection, in particular total reflection, at a cooling channel boundary surface of the at least one cooling channel ensures an efficient redirection of at least one portion of the light to be deflected. In particular, when the light is totally reflected at the cooling channel boundary surface of the at least one cooling channel, the light is not absorbed by or transmitted into the cooling channel. The light does not experience any attenuation by the cooling channel. The intensity of the light emitted by means of the emitter is increased.

Further features, advantages and details of the invention will be apparent from the following description of several embodiments.

DESCRIPTION OF THE PREFERRED EMBODIMENTS

Figure 1:
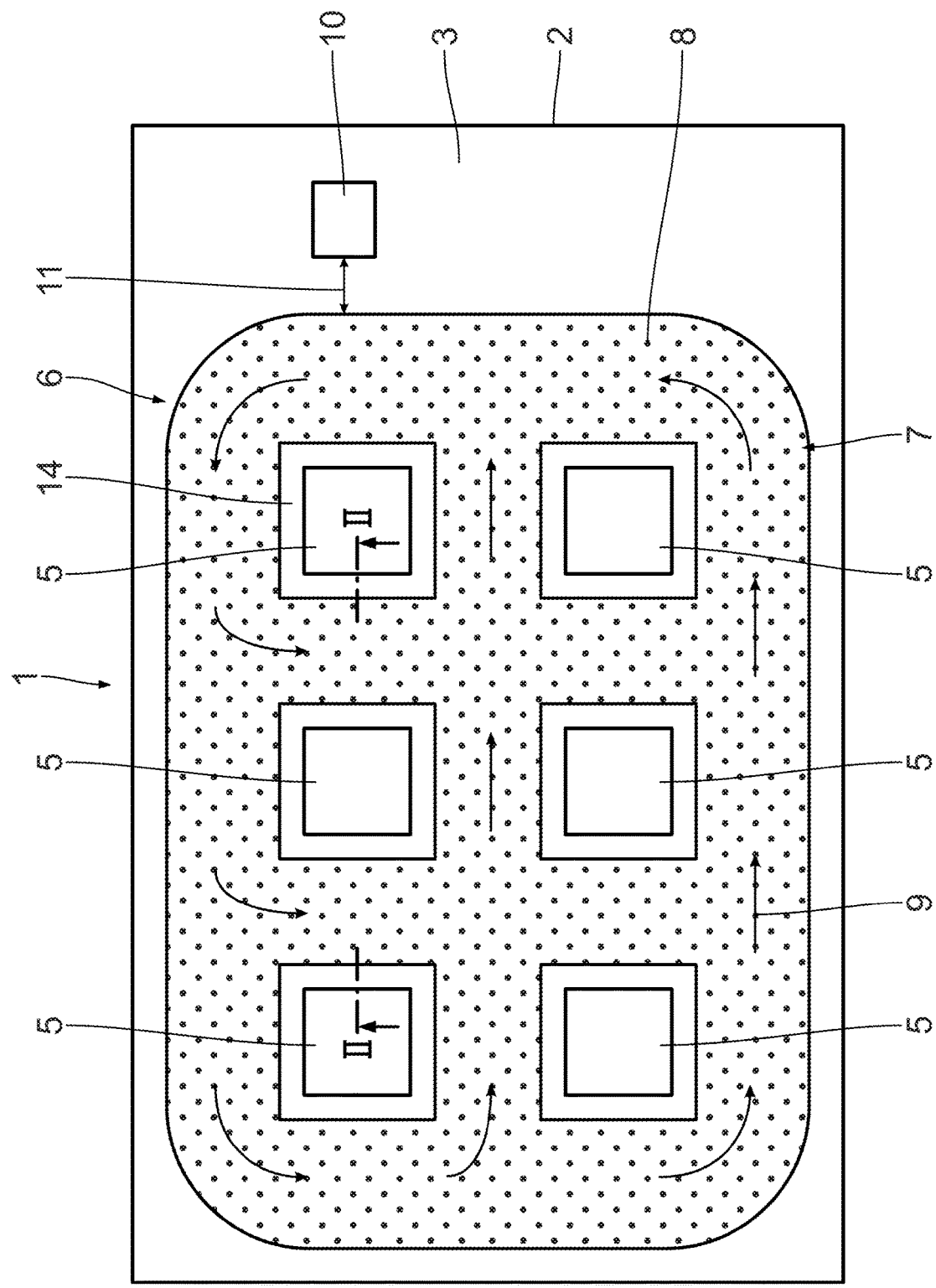
FIG. 1 shows a top view of a schematically illustrated, first embodiment of a luminaire with multiple LED light sources and an active cooling unit.
Figure 2:
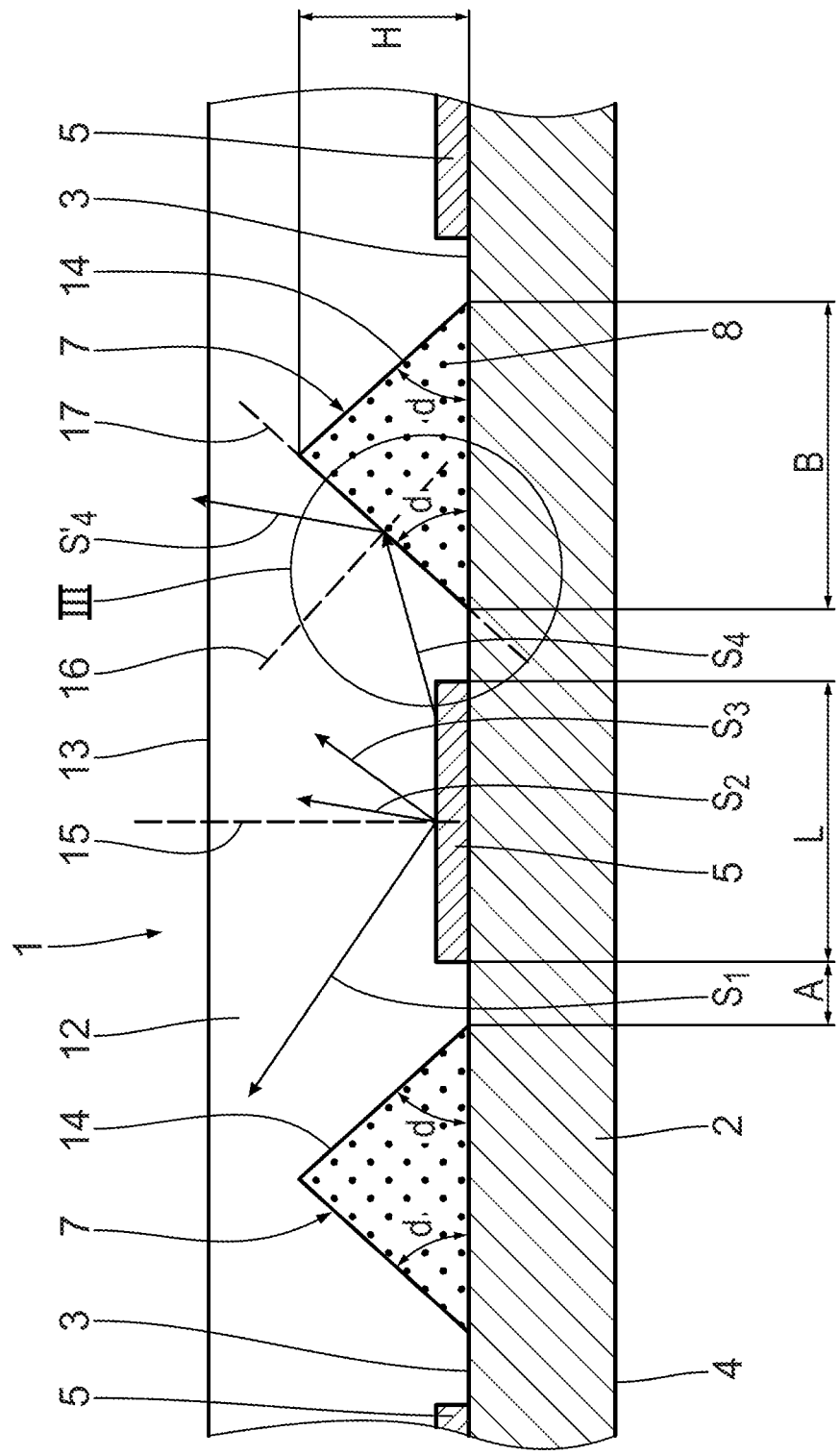
FIG. 2 shows a cross-section through the luminaire according to FIG. 1 along the section line II-II.
Figure 3:
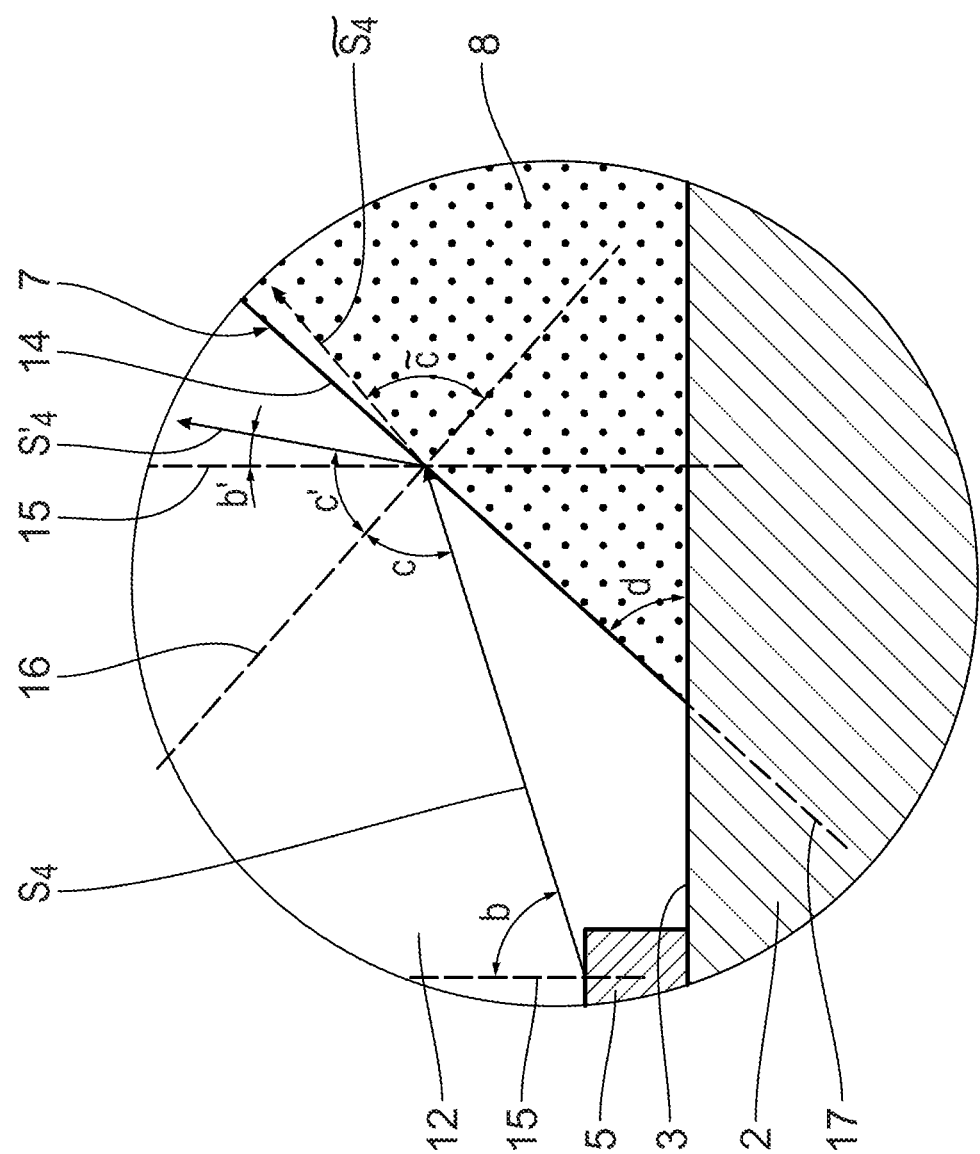
FIG. 3 shows a detail III of the sectional illustration according to FIG. 2.

In FIGS. 1 to 3, a first embodiment of an emitter in the form of a luminaire 1 is shown. The luminaire 1 has a substrate 2 with a first substrate surface 3 and a second substrate surface 4 spaced apart from the first substrate surface 3 by a substrate thickness. A plurality of LED elements in the form of LED lighting means 5 are arranged on the first substrate surface 3. The luminaire 1 further comprises an active cooling unit 6 having a network of cooling channels 7 arranged on the first substrate surface 3.

In the illustrated embodiment, six LED lighting means 5 are arranged on the first substrate surface 3. The LED lighting means 5 are arranged in the form of a regular grid of three by two LED lighting means 5 on the first substrate surface 3. The number and the arrangement of the LED lighting means are not essential and may vary depending on the embodiment example.

The LED lighting means 5 serve to generate visible light to be emitted by the luminaire 1. The light that can be generated by means of the LED lighting means 5 is electromagnetic radiation in the visible range. This means that the light generated by means of the LED lighting means 5 has a frequency or a wavelength which is in the frequency range or wavelength range of visible light. The LED lighting means 5 are LED chips.

Heat is generated during the generation of light by means of the LED lighting means 5. The active cooling unit 6 serves to cool the LED lighting means 5. For this purpose, a coolant 8 is conveyed in the cooling channels 7. The coolant 8 is in the form of a cooling liquid, which is shown schematically by dots in FIGS. 1 and 2. The coolant 8 flows in the cooling channels 7 along the flow direction symbolically indicated by the arrows 9 in FIG. 1. For pumping or conveying the coolant 8 in the cooling channels 7, the luminaire 1 has a pump 10. The pump 10 is shown schematically in FIG. 1 and is connected to the cooling channels 7 via a fluid connection 11, which is also shown schematically. In the embodiment shown, the pump 10 is arranged on the first substrate surface 3. In further embodiments not shown, the pump 10 is directly integrated into the network of cooling channels 7. In yet other embodiments not shown, the pump 10 is arranged in the region of the second substrate surface 4 or independently of the substrate 2. In particular, the fluid connection 11 may pass through or away from the substrate 2.

The cooling channels 7 are arranged on the first substrate surface 3. The cooling channels 7 are arranged in a plane formed by the first substrate surface 3 adjacent to the LED lighting means 5. The cooling channels 7 are circumferentially adjacent to the LED lighting means 5. The cooling channels 7 are circumferentially arranged on all four sides of the LED lighting means 5. In the plane formed by the first substrate surface 3, the cooling channels 7 circumferentially surround the individual LED lighting means 5. The arrangement of the cooling channels 7 on the same substrate surface as the LED lighting means 5, namely on the first substrate surface 3, has in particular the advantage that the cooling of the LED lighting means 5 takes place directly and not via the substrate 2. This ensures a particularly efficient cooling of the LED lighting means 5 by the active cooling unit 6.

The LED lighting means 5 as well as the cooling channels 7 are embedded in a transparent encapsulation 12. The cooling channels 7 are formed as a cavity in the encapsulation 12. The cooling channels 7 therefore do not have any further cooling channel enclosure. This facilitates the manufacture of the cooling channels 7. The geometry of the cooling channels 7, in particular their cross-section, can be flexibly determined.

The encapsulation 12 defines an emission surface 13 opposite the first substrate surface 3 with respect to the LED lighting means 5. Light generated by means of the LED lighting means 5 emerges from the emission surface 13 of the luminaire 1. In the embodiment shown, the emission surface 13 is planar and parallel to the first substrate surface 3. In other embodiment examples not shown, the emission surface may also have a different relative position to the first substrate surface and/or a different shape.

In FIG. 2, the cross-section of the cooling channels 7 of the luminaire 1 is shown. The cooling channels 7 have a cross-section in the form of an isosceles triangle. The base of the triangle lies in the plane formed by the first substrate surface 3. The legs of the isosceles triangle extend at a base angle d from the first substrate surface 3 towards the emission surface 13. The planes defined by the legs of the isosceles triangle have a surface normal 16 and a surface tangent 17. The surface tangent 17 is parallel to the plane of the respective leg. The base angle d is therefore defined as the angle at which the surface tangent 17 runs to the first substrate surface 3. The cooling channels 7 have a height H in the direction perpendicular to the first substrate surface 3.

The cooling channels 7 have a cooling channel boundary surface 14 to the encapsulation 12. In the embodiment shown, in which the cooling channels 7 are formed by cavities in the encapsulation 12, the cooling channel boundary surface 14 is formed by a transition zone between the encapsulation 12 and the coolant 8. In other embodiments not shown, the cooling channel boundary surface 14 may also be formed by a cooling channel housing.

The cooling channel boundary surface 14 runs along the legs of the triangular cross-section of the cooling channels 7. As can be seen in FIG. 2, a region of the cooling channel boundary surface 14 facing one of the LED lighting means 5 extends away from the respective adjacent LED lighting means 5 with increasing distance from the first substrate surface 3. In other words, a distance of the cooling channel boundary surface 14 measured in the plane of the first substrate surface 3 from the respective adjacent LED lighting means 5 increases with increasing distance perpendicular to the first substrate surface 3. As a result, the cooling channels 7, in particular their cooling channel boundary surfaces 14, define a light cone opening from the first substrate surface 3 towards the emission surface 13 for light that can be generated by means of the LED lighting means 5.

With reference to FIGS. 2 and 3, the emission of light by means of the luminaire 1 will be described below. Due to the arrangement of the cooling channels 7, these enable a bundling of the light generated by means of the LED lighting means 5.

Perpendicular to the first substrate surface 3, a main emission direction 15 is defined. In the embodiment shown, the main emission direction 15 is perpendicular to the emission surface 13. The LED lighting means 5 generate light which is emitted by the LED lighting means 5 over the entire solid angle range of $2\pi$ above the first substrate surface 3. Shown by arrows in FIG. 2 are beam paths of exemplary light beams $S_i$ with i=1, 2, 3, 4 that can be generated by the LED lighting means 5 shown centrally in FIG. 2.

The cooling channels 7 do not overlap with the LED lighting means 5 in the direction of the main emission direction 15. The cooling channels 7 are therefore not arranged in a beam path of light beams running substantially in the direction of the main emission direction 15. Out of the beam paths shown by way of example in FIG. 2, the light beams $S_1$, $S_2$, $S_3$ do not impinge on the cooling channels 7. The light beams $S_1$, $S_2$, $S_3$ arrive directly at the emission surface 13 and are emitted from there into an environment of the luminaire 1. However, the cooling channels 7 are arranged in a beam path of at least one portion of the light generated by means of the at least one LED lighting means 5. Out of the light beams shown by way of example in FIG. 2, the light beam $S_4$ impinges on the region of the cooling channel boundary surfaces 14 of the cooling channel 7 shown on the right in FIG. 2 adjacent to the centrally shown LED lighting means 5. The light beam $S_4$ is reflected at the cooling channel boundary surface 14 in the direction of the emission surface 13. The reflected light beam is drawn as light beam $S'_4$ in FIGS. 2 and 3. The light incident on the cooling channels 7 is redirected at the cooling channel boundary surface 14. The redirection is described in detail below with reference to FIG. 3.

The light beam $S_4$ has an emission angle b with respect to the main emission direction 15. The beam angle b is generally between 0° and 90°. When impinging on the cooling channel boundary surface 14, the light beam $S_4$ has an angle of incidence c in relation to a surface normal 16 of the cooling channel boundary surface 14. The reflected light beam $S'_4$ has an angle of reflection c' in relation to the surface normal 16, wherein the angle of reflection c' is equal in magnitude to the angle of incidence c. The angle between the reflected light beam $S'_4$ and the main emission direction 15 is denoted by b'. Due to the reflection at the cooling channel boundary surface 14 extending away from the LED lighting means 5, the following applies to the angle b': $0° \leq b' < b$. Due to the reflection at the cooling channel boundary surface 14, the angle b' of the reflected light beam $S'_4$ in relation to the main emission direction 15 is reduced compared to the emission angle b of the light beam $S_4$. The light reflected at the cooling channel boundary surface 14 is deflected in the direction of the main emission direction 15. The cooling channels 7 redirect and bundle the light generated by the LED lighting means 5 in the main emission direction 15. The light intensity in the direction of the main emission direction 15 is increased.

As a rule, electromagnetic radiation is not only reflected when it impinges on a boundary surface, but is also partially transmitted through the boundary surface. Therefore, in FIG. 3, a transmitted light beam $\tilde{S}_4$ of the light beam $\tilde{S}_4$ impinging on the cooling channel boundary surface 14 is also indicated. The transmitted light beam $\tilde{S}_4$ runs at a transmission angle $\tilde{c}$ to the surface normal 16. The transmission angle $\tilde{c}$ is determined according to the law of Snellius, according to which $$n_E \sin c = n_K \sin \tilde{c} \qquad (3),$$

wherein $n_E$ is the refractive index of the encapsulation 12 and $n_K$ is the refractive index of the coolant 8. Since the refractive index $n_E$ of the encapsulation 12 is greater than the refractive index $n_K$ of the coolant 8, the transmission angle $\tilde{c}$ is greater than the angle of incidence c. By reducing, in particular avoiding transmitted light beams, the intensity of the light in the main emission direction 15 can be increased. For this purpose, the luminaire 1 makes use of the effect of total reflection which occurs at a certain angle of incidence c when passing from the optically denser to the optically thinner medium, i.e. from a medium with a larger refractive index to a medium with a smaller refractive index. In the case of total reflection, the angle is $\tilde{c} \geq 90°$. Depending on the refractive indices of the encapsulation 12 or the cooling medium 8, the condition for the angle of incidence c from which on total reflection occurs is therefore:

$$c \geq \sin^{-1}\left(\frac{n_K}{n_E}\right). \qquad (4)$$

The angle of incidence c depends on the emission angle b and the base angle d. The smaller the emission angle b, the larger the angle of incidence c. In the embodiment shown, the base angle d is selected in such a way that the angle of incidence c leads to total reflection irrespective of the emission angle b, in particular also for the emission angle b=90°. To the base angle d, the following condition therefore applies:

$$d \leq 90° - \sin^{-1}\left(\frac{n_K}{n_E}\right). \qquad (5)$$

In the shown embodiment, the refractive index of the transparent encapsulation 12 is between 1.45 and 1.59. In the shown embodiment, an epoxy resin is used for the transparent encapsulation 12. For example, the epoxy resin used for the encapsulation is the epoxy resin sold under the trade name "Nitto Denko NT-8524", which has a refractive index of 1.57.

Various fluids, in particular liquids, can be used as the coolant 8. An exemplary coolant is ethylene glycol, which has a refractive index of 1.43. For $n_E=1.57$ and $n_K=1.43$, according to formula (5), the following results for the base angle d, from which total reflection is ensured independently of the emission angle b: $d \leq 21.7°$. An alternative coolant is water, which has a refractive index of 1.33. In this case, the following results for the base angle d for which total internal reflection is ensured independently of the beam angle b: $d \leq 32°$.

In alternative embodiments not shown, the transparent encapsulation is made of a silicone elastomer. An exemplary silicone elastomer sold under the trade name "Dow Corning OE-6550" has a refractive index of 1.54.

The cooling channels 7 have a height H perpendicular to the first substrate surface 3 and thus in the main emission direction 15. The height H depends on a width B of the base of the triangular cross-section of the cooling channels 7 and on the base angle d. As the base angle d increases and/or the width B increases, the height H increases. As the height increases, a greater proportion of the light generated by means of the LED lighting means 5 impinges on the cooling channel boundary surface 14 and is redirected at the latter. The bundling effect caused by means of the cooling channels 7 is therefore dependent on the height H and the base angle d of the cross-section of the cooling channel 7. The light intensity and bundling of the light emitted by the luminaire 1 along the main emission direction 15 can therefore be adjusted by the geometry of the cooling channels 7. The height H is for example between 1 mm and 20 mm, in particular between 1 mm and 15 mm, preferably about 10 mm. The width of the cooling channels 7 is for example between 5 mm and 50 mm, in particular between 5 mm and 40 mm, preferably about 20 mm. The base angle d is for example between 0° and 90°, in particular between 10° and 80°, in particular between 15° and 45°, preferably about 35°.

Further parameters for influencing the emission characteristics are the extension L of the LED lighting means 5 measured in the direction of the first substrate surface 3 and the distance A between the cooling channels 7 and the LED lighting means 5 measured in the direction of the first substrate surface 3 (cf. FIG. 2). The distance A can be, for example, between 0 mm and 5 mm, in particular between 0.5 mm and 2 mm, in particular about 1 mm. At a distance A=0 mm, the LED lighting means 5 and the cooling channels 7 are arranged directly adjacent to each other on the first substrate surface 3. An exemplary extension L of the LED lighting means 5 may be between 0.1 mm and 5 mm, in particular between 0.2 mm and 2 mm, in particular about 1 mm. In an exemplary embodiment, the extension of the LED lighting means 5 is about 1 mm and the distance between the LED lighting means 5 and the adjacent cooling channels 7 is 1 mm in each case. In the exemplary embodiment, the base angle d=35°, the height H=7.5 mm and the width B=21 mm.

Figure 4:
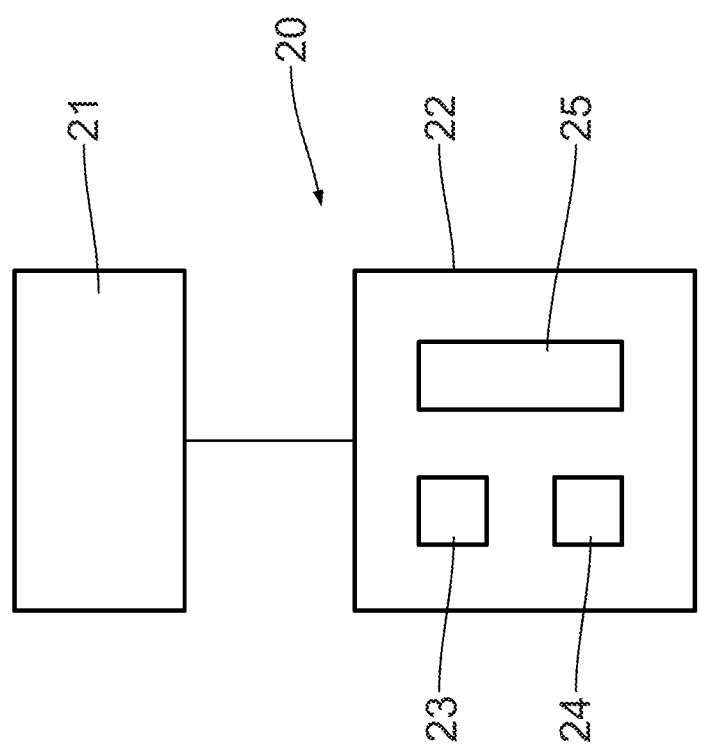
FIG. 4 shows a schematic process flow of an operating method for the luminaire according to FIG. 1.

In FIG. 4, the sequence of an operating method 20 for the luminaire 1 is shown schematically. In a providing step 21, the luminaire 1 is provided.

The providing step 21 is followed by an emitting step 22. In the emitting step 22, light is emitted by means of the luminaire 1. The light to be emitted is generated in a light generation step 23 by means of the LED lighting means 5. The light generated by means of the LED lighting means 5 is in the visible range. In a redirecting step 24, at least one portion of the light generated by means of the LED lighting means 5 is redirected by the cooling channels 7. In this process, the light is reflected, in particular totally reflected, at a cooling channel boundary surface 14.

In a cooling step 25, the LED lighting means 5 are cooled by means of the active cooling unit 6. Here, coolant 8 is pumped through the cooling channels 7 by means of the pump 10.

Figure 5:
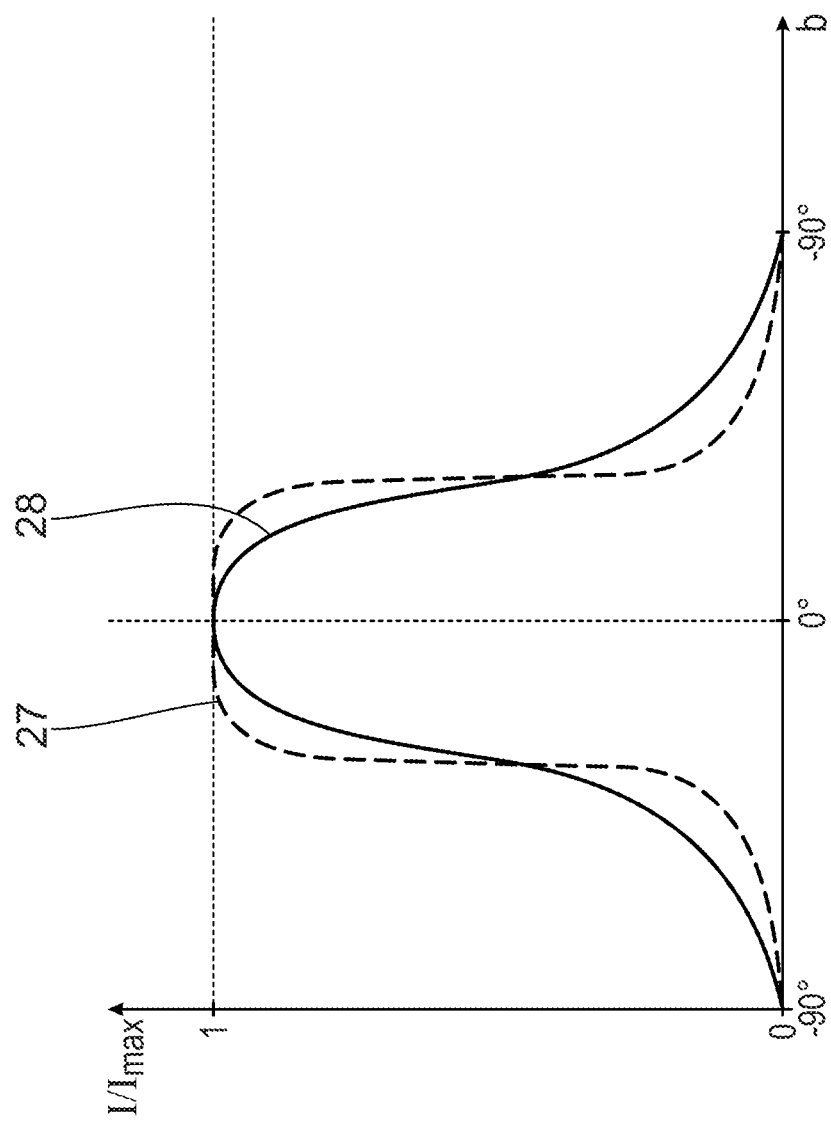
FIG. 5 shows a schematic illustration of the emission characteristics of the luminaire according to FIG. 1.

FIG. 5 schematically shows the emission characteristics 27 of the luminaire 1. The intensity I of the light generated by an LED lighting means varies with the beam angle b. For determining the emission characteristics 27, the intensity $I_{max}$ normalized to the maximum intensity I is applied through the emission angle b. The emission characteristics 27 is shown as a dashed line. For the sake of comparison, a reference emission characteristics 28 is also schematically shown as a solid line in FIG. 5. The reference radiation characteristics 28 corresponds to the emission characteristics of a reference luminaire which does not have cooling channels 7 on the first substrate surface 3, but which is otherwise configured like the luminaire 1. In the reference luminaire, the structure of which corresponds to the structure of commercially available LED lamps, there is no redirection of one portion of the light generated by means of the LED lighting means at cooling channels. The comparison of the emission characteristics 27 with the reference emission characteristics 28 clearly shows that, due to the redirection of one portion of the light generated by means of the LED lighting means 5 at the cooling channels 7, the light is bundled about the main emission direction for which b=0°. In particular, the emission characteristics 27 has an increased intensity I for small amounts of the emission angle b, compared to the reference emission characteristics 28. For larger amounts of the emission angle b, in particular in the ranges close to 90° or −90°, the intensity I of the emission characteristics 27 is reduced compared to the reference emission characteristics 28.

In further embodiments not shown, the base angle d and/or the ratio of the refractive indices $n_K/n_E$ is selected such that the condition in formula (5) is not fulfilled. Therefore, total reflection is not guaranteed for all beam angles b. In such embodiments, total reflection occurs only for light beams for whose beam angle b $$b \leq 180° - d - \sin^{-1}\left(\frac{n_K}{n_E}\right). \quad (6)$$

In further embodiments, the cooling channels 7 have a different cross-sectional geometry. For example, the cooling channels 7 have a polygonal cross-section. Polygonal cross-sections have the advantage of planar regions of the cooling channel boundary surface 14, so that a controlled redirection of the light incident thereon is ensured.

Figure 6:
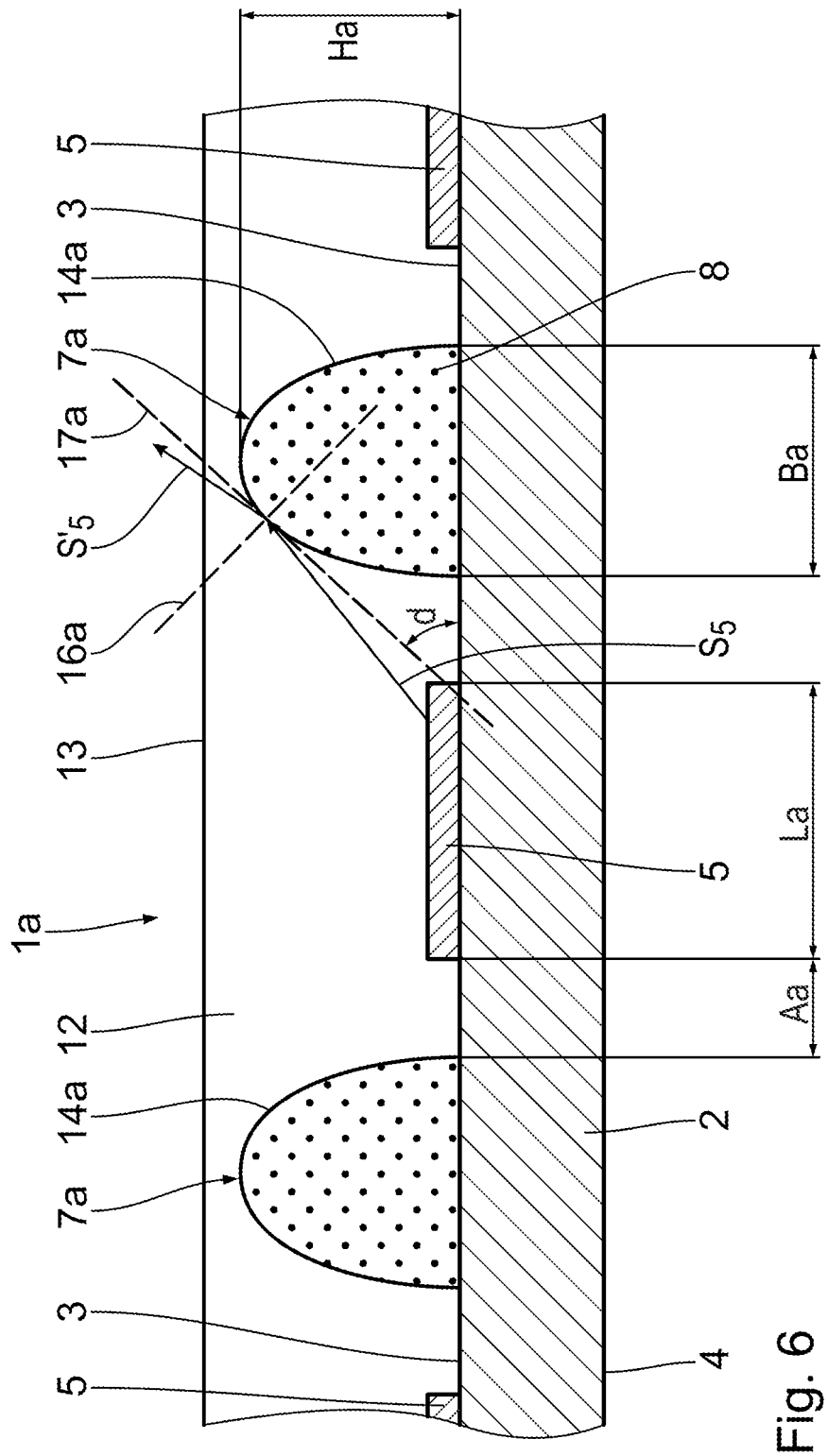
FIG. 6 shows a cross-section through a second embodiment of a luminaire.

FIG. 6 shows an alternative embodiment of a luminaire 1a. Components that have already been described in connection with the embodiment in FIGS. 1 to 3 bear the same reference signs. Components that are structurally different but functionally identical bear the same reference sign with a subsequent a.

The luminaire 1a differs from the luminaire 1 shown in FIGS. 1 to 3 only in the geometry of the cooling channels 7a. The cooling channels 7a have a dome-like cross-section. With the dome-like cross-section of the cooling channels 7a, a large height Ha is possible even with a small width Ba of the cooling channels 7a. The dome-shaped cross-section has two side portions extending away from the first substrate surface 3 in a substantially straight line. At their end facing away from the first substrate surface 3, the cooling channels 7a have a rounded tip.

In contrast to the triangular cross-section of the cooling channel 7 shown in FIG. 3, the cooling channel boundary surface 14a of the cooling channel 7a does not have a uniform base angle d. The base angle d is therefore defined in regions as the angle at which a surface tangent 17a of the respective region of the cooling channel boundary surface 14a runs in relation to the first substrate surface 3.

In the region of the tip of the cooling channels 7a, the base angle d is small enough to satisfy equation (5). In this region, the angle of incidence c in relation to the surface normal 16a is large enough to generate total reflection, as shown by the exemplary light beam $S_5$ in FIG. 6.

Figure 7:
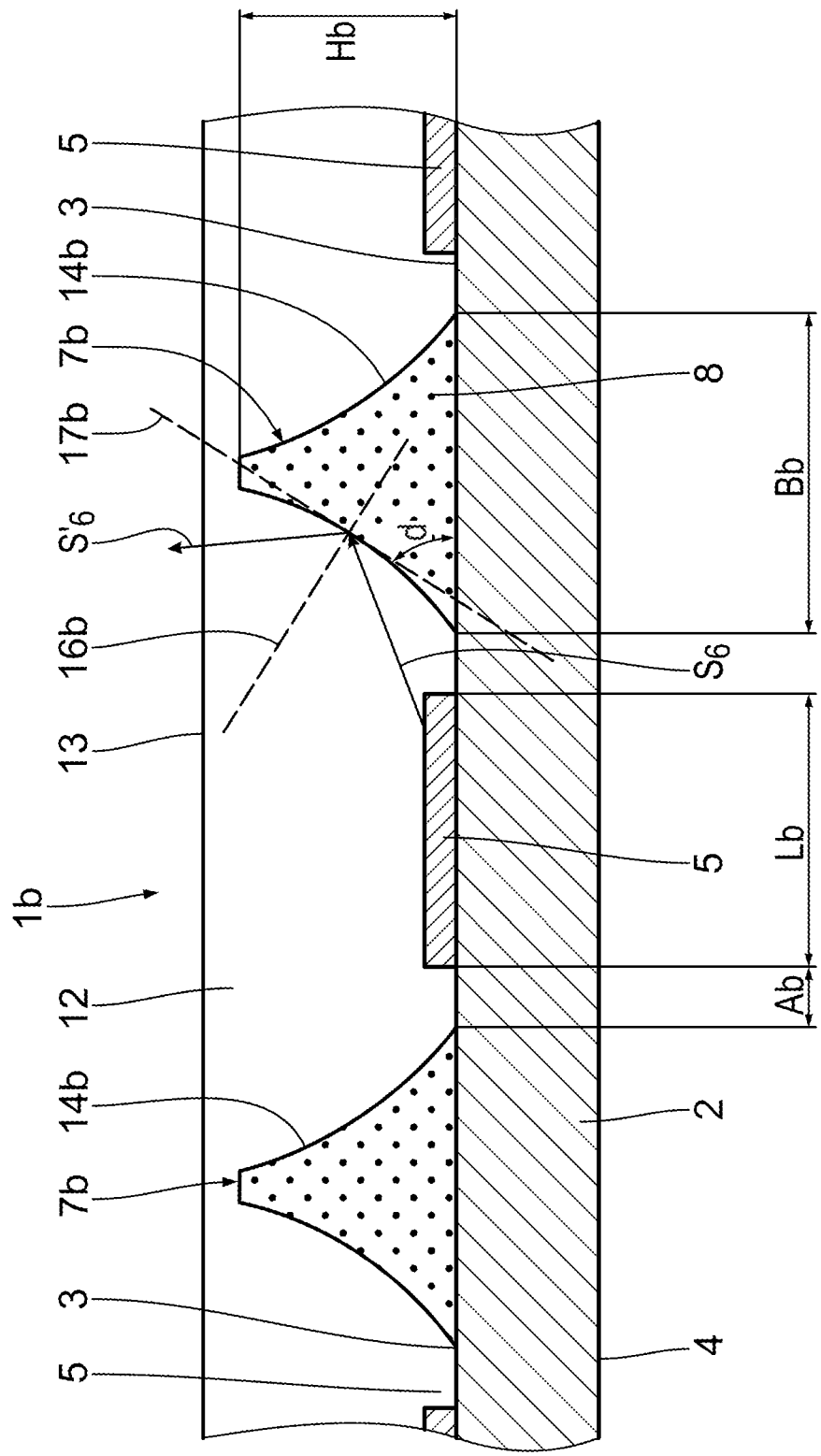
FIG. 7 shows a cross-sectional view of a third embodiment of a luminaire.

In FIG. 7, a further alternative embodiment of a luminaire 1b is shown. Components that have already been described in connection with the embodiment in FIGS. 1 to 3 bear the same reference signs. Components that are structurally different but functionally identical bear the same reference sign with a subsequent b.

The luminaire 1b differs from the luminaire 1 shown in FIGS. 1 to 3 or from the luminaire 1a shown in FIG. 6 only in the geometry of the cooling channels 7b. The cooling channels 7b have a wedge-shaped cross-section. The regions of the cooling channel boundary surface 14b facing the LED lighting means 5 have a concave curvature. Overall, the cooling channel 7b has a substantially lenticular cross-section as a result. Due to the concave curvature of the regions of the cooling channel boundary surface 14b facing the LED lighting means 5, the base angle d decreases with decreasing distance from the first substrate surface 3. This ensures that light beams having a large beam angle b are incident on regions of the cooling channel boundary surface 14b having a small base angle d. This can efficiently ensure the condition of total reflection at the cooling channel boundary surface 14b. The cooling channels 7b enable a particularly efficient bundling of the light generated by means of the LED lighting means 5. In FIG. 7, an exemplary light beam $S_6$ is shown which is totally reflected at the cooling channel boundary surface 14b.

In order to improve the reflection of light beams at the cooling channels, a reflective layer is provided at the cooling channel boundary surface in further embodiments not shown. In some embodiments, the cooling channel boundary surface is coated with a reflective material for this purpose. In yet other embodiments, the cooling channels comprise a cooling channel housing with a reflective surface. A reflective layer is particularly advantageous when the base angle d does not fulfil the condition of formula (5) for all regions of the cooling channel boundary surface facing the respective adjacent LED lighting means 5, for example in the case of the cross-sectional shape of the cooling channels 7a shown in FIG. 6.

Alternative embodiments relate to emitters for emitting infrared light or UV light. The emitters may be designed like the luminaires described above, wherein the corresponding LED elements are designed to generate infrared light or UV light, respectively. The light to be emitted is at least partially redirected by the respective cooling channels without undergoing a change in frequency.

The invention claimed is:

1. An emitter for emitting light, comprising
a substrate having a substrate surface,
at least one LED element arranged on the substrate surface for generating the light to be emitted, and
an active cooling unit for cooling the at least one LED element with at least one cooling channel for a coolant,
wherein the at least one cooling channel is arranged in a beam path of at least a part of the light to be emitted which can be generated by means of the at least one LED element, for redirecting the light to be emitted,
wherein the redirection of the light to be emitted takes place without changing a frequency of the light to be emitted,
wherein the at least one LED element and the at least one cooling channel are embedded in a transparent encapsulation, wherein a refractive index $n_E$ of the transparent encapsulation is greater than a refractive index $n_K$ of the cooling channel, and wherein a surface tangent of a region of a cooling channel boundary surface of the at least one cooling channel facing the at least one LED element runs at an angle d to the substrate surface, where the following applies:

$$d \leq 90° - \sin^{-1}(n_K/n_E).$$

2. The emitter according to claim 1, wherein at least part of the light to be emitted can be redirected by the at least one cooling channel in the direction of a predefined main emission direction.

3. The emitter according to claim 1, wherein at least part of the light to be emitted can be redirected by the at least one cooling channel in a main emission direction defined to be perpendicular to the substrate surface.

4. The emitter according to claim 1, wherein a cooling channel boundary surface of the at least one cooling channel is formed, at least in regions, in such a way that at least one portion of the light to be emitted is reflected at the cooling channel boundary surface.

5. The emitter according to claim 1, wherein the at least one cooling channel is arranged adjacent to the at least one LED element, in a plane formed by the substrate surface.

6. The emitter according to claim 5, wherein the at least one LED element adjoins the at least one cooling channel on at least two sides in the plane defined by the substrate surface.

7. The emitter according to claim 5, wherein a region of a cooling channel boundary surface of the at least one cooling channel which faces the respectively adjacent LED element extends away from the adjacent LED element with increasing distance from the substrate surface.

8. The emitter according to claim 1, wherein the at least one cooling channel is formed as a cavity in the encapsulation.

9. The emitter according to claim 1, wherein the encapsulation comprises at least one of the group comprising a silicone elastomer and a resin.

10. The emitter according to claim 1, wherein the encapsulation comprises at least one of the group comprising a silicone elastomer and an epoxy resin.

11. The emitter according to claim 1, wherein a cross-section of the at least one cooling channel is polygonal in shape.

12. The emitter according to claim 1, wherein a cross-section of the at least one cooling channel is triangular.

13. The emitter according to claim 1, wherein the at least one cooling channel has an extension perpendicular to the substrate surface of between 1 mm and 20 mm.

14. The emitter according to claim 1, wherein the at least one cooling channel has an extension perpendicular to the substrate surface of between 1 mm and 15 mm.

15. The emitter according to claim 1, wherein the at least one cooling channel contains a coolant comprising ethylene glycol.

16. A method of emitting light by means of an emitter comprising the steps of:
providing an emitter, comprising:
a substrate with a substrate surface,
at least one LED element arranged on the substrate surface for generating light to be emitted, and
an active cooling unit for cooling the at least one LED element, with at least one cooling channel for a coolant,
wherein the at least one cooling channel is arranged in a beam path of at least a portion of the light to be emitted which can be generated by means of the at least one LED element,
generating the light to be emitted by means of the at least one LED element,
cooling of the at least one LED element by means of the active cooling unit and
redirecting at least a portion of the light to be emitted by means of the at least one cooling channel,
wherein the redirection of the light to be emitted takes place without changing a frequency of the light to be emitted,
wherein the at least one LED element and the at least one cooling channel are embedded in a transparent encapsulation,
wherein a refractive index $n_E$ of the transparent encapsulation is greater than a refractive index $n_K$ of the cooling channel, and
wherein a surface tangent of a region of a cooling channel boundary surface of the at least one cooling channel facing the at least one LED element runs at an angle d to the substrate surface, where the following applies:

$$d \leq 90° - \sin^{-1}(n_K/n_E).$$

17. The method according to claim 16, wherein at least one portion of the light to be emitted is deflected by the at least one cooling channel in the direction of a predefined main emission direction.

18. The method according to claim 16, wherein at least one portion of the light to be emitted is deflected by the at least one cooling channel in the direction of a main emission direction defined to be perpendicular to the substrate surface.

19. The method according to claim 16, wherein the redirection of at least one portion of the light to be emitted takes place by reflection at a cooling channel boundary surface of the at least one cooling channel.

20. The method according to claim 16, wherein the redirection of at least one portion of the light to be emitted takes place by total reflection, at a cooling channel boundary surface of the at least one cooling channel.

* * * * *